US009672102B2

(12) United States Patent
Goda et al.

(10) Patent No.: US 9,672,102 B2
(45) Date of Patent: Jun. 6, 2017

(54) NAND MEMORY DEVICES SYSTEMS, AND METHODS USING PRE-READ ERROR RECOVERY PROTOCOLS OF UPPER AND LOWER PAGES

(71) Applicant: Intel Corporation, Santa Clara, CA (US)

(72) Inventors: Akira Goda, Boise, ID (US); Pranav Kalavade, San Jose, CA (US); Charan Srinivasan, Redwood City, CA (US)

(73) Assignee: Intel Corporation, Santa Clara, CA (US)

( * ) Notice: Subject to any disclaimer, the term of this patent is extended or adjusted under 35 U.S.C. 154(b) by 170 days.

(21) Appl. No.: 14/314,663

(22) Filed: Jun. 25, 2014

(65) Prior Publication Data

US 2015/0378815 A1 Dec. 31, 2015

(51) Int. Cl.
  *G11C 29/00* (2006.01)
  *G06F 11/10* (2006.01)
(52) U.S. Cl.
  CPC .................. *G06F 11/1068* (2013.01)
(58) Field of Classification Search
  None
  See application file for complete search history.

(56) References Cited

U.S. PATENT DOCUMENTS

| 8,982,617 B1* | 3/2015 | Mekhanik | G11C 16/3418 365/185.02 |
| 2008/0266978 A1* | 10/2008 | Goda | G11C 11/5628 365/185.26 |
| 2008/0273385 A1* | 11/2008 | Goda | G11C 5/145 365/185.03 |
| 2011/0134697 A1* | 6/2011 | Zhao | G11C 11/5642 365/185.12 |
| 2011/0145668 A1 | 6/2011 | Kim et al. | |
| 2012/0030506 A1* | 2/2012 | Post | G06F 11/008 714/6.1 |

(Continued)

FOREIGN PATENT DOCUMENTS

| JP | 2009/016034 | 1/2009 |
| JP | 2009/064440 | 3/2009 |

(Continued)

OTHER PUBLICATIONS

Helm, et al., "A 128Gb MLC NAND-Flash Device Using 16nm Planar Cell", Non-Volatile Memory Solutions, International Solid-State Circuits Conference, 2014 IEEE, ISSCC 2014, Session 19, Feb. 12, 2014, 3 pages.

*Primary Examiner* — Daniel McMahon
(74) *Attorney, Agent, or Firm* — Thorpe North & Western, LLP

(57) ABSTRACT

Technology for programming a page of memory in a NAND memory device is disclosed and described. In an example, a method includes applying initial programming pulses for lower page programming of the page and pre-reading data of the lower page. The method also includes determining whether to apply an error recovery operation to the data of the lower page. Data indicative of secondary programming pulses to be used for programming upper page data are stored and the upper page data is programmed based on the secondary programming pulses and the data of the lower page.

14 Claims, 7 Drawing Sheets

(56) References Cited

U.S. PATENT DOCUMENTS

| | | | | |
|---|---|---|---|---|
| 2012/0117306 A1* | 5/2012 | Ahmed | ............... | G11C 16/0483 |
| | | | | 711/103 |
| 2012/0230104 A1 | 9/2012 | Kim et al. | | |
| 2012/0311406 A1* | 12/2012 | Ratnam | ................... | G06F 11/10 |
| | | | | 714/768 |
| 2014/0063961 A1* | 3/2014 | Sakai | .................. | G11C 11/5628 |
| | | | | 365/185.17 |
| 2014/0075252 A1* | 3/2014 | Luo | ..................... | G11C 11/5635 |
| | | | | 714/721 |
| 2014/0143631 A1* | 5/2014 | Varanasi | ............... | G11C 7/1006 |
| | | | | 714/763 |
| 2014/0160845 A1* | 6/2014 | Ratnam | ................ | G11C 29/028 |
| | | | | 365/185.09 |
| 2014/0164872 A1* | 6/2014 | Frickey | ............... | G11C 11/5628 |
| | | | | 714/764 |

FOREIGN PATENT DOCUMENTS

| JP | 2012/123880 | 6/2012 |
|---|---|---|
| JP | 2013/254542 | 12/2013 |

* cited by examiner

NAND MEMORY DEVICES SYSTEMS, AND METHODS USING PRE-READ ERROR RECOVERY PROTOCOLS OF UPPER AND LOWER PAGES

TECHNICAL FIELD

Embodiments described herein relate generally to NAND memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage node (e.g., a floating gate or charge trap), or other physical phenomena (e.g., phase change or polarization), determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
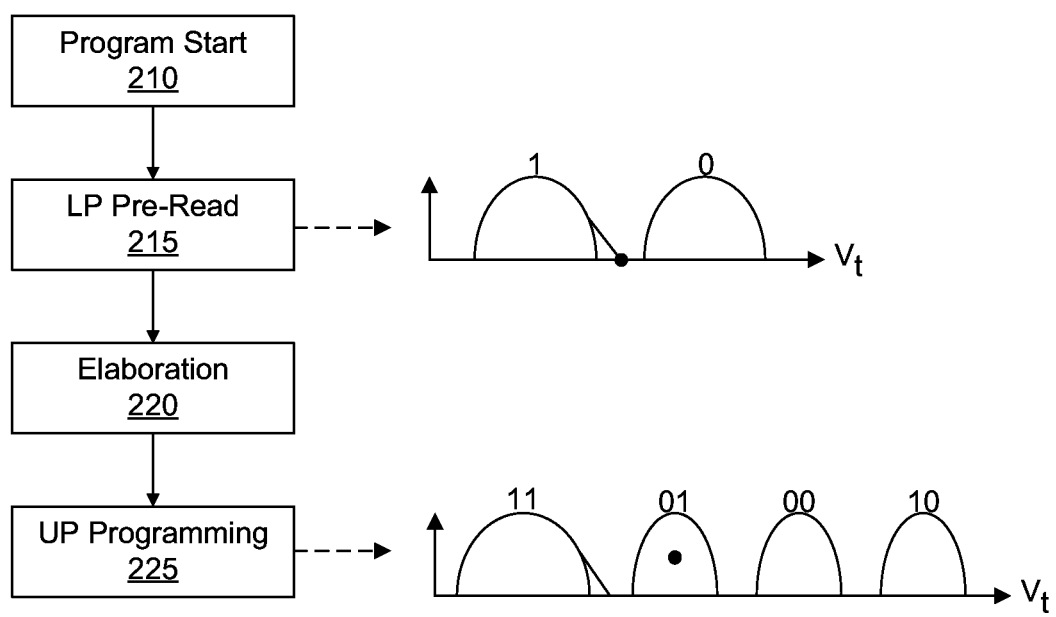
FIG. 1 illustrates an upper page programming process with diagrams of a lower page voltage distribution and a correct upper page voltage based on an error correction of the lower page voltage in accordance with an invention example.

Reference will now be made to the exemplary embodiments illustrated, and specific language will be used herein to describe the same. It will nevertheless be understood that no limitation of the scope of this disclosure is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics may be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

Example Embodiments

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

Reference throughout this specification to "an example" means that a particular feature, structure, or characteristic described in connection with the example is included in at least one invention embodiment. Thus, appearances of the phrases "in an example" in various places throughout this specification are not necessarily all referring to the same embodiment.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore it is to be understood that in this specification, the recitation of a numerical value in connection with the term "about" is also intended to provide support for the actual numerical value in and of itself apart from the term "about". Thus for example, the recitation of "about 30" also includes express support for the plain numerical value of "30".

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and invention examples may be referred to herein along with alternatives for the various components thereof. It is understood that such embodiments, examples, and alternatives are not to be construed as defacto equivalents of one another, but are to be considered as separate and autonomous representations of various invention embodiments.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

As the performance and complexity of electronic systems increase, the requirement for additional memory in a system also increases. However, it is desirable that the parts count be minimized in order to continue to reduce the costs of the system. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a data state, e.g., a bit pattern, to a specific threshold voltage (Vt) range of the cell. This technology permits the storage of two or more bits of information per cell, depending on the quantity of voltage ranges assigned to the cell and the stability of the assigned voltage ranges during the lifetime operation of the memory cell.

The voltage necessary to program (or erase) a cell is highly dependent on the usage of the cell, such as the number of times that the particular cell has been programmed and/or erased (cycled) in the past. A cell that has been through no or very few program/erase cycles will typically require application of a higher voltage at its gate to raise its threshold voltage by a particular amount as compared to a cell that has been through a higher number of cycles.

For example, a cell that has never been programmed before can be programmed with an initial program voltage that is relatively high compared to a cell that has been cycled many (on the order of thousands) times. A cell that has been cycled many times will have its threshold voltage moved a larger amount by the same program pulse than a cell that has not previously been cycled, or has been cycled only a few times. If a high initial program voltage is used for a cell that has been cycled many times, the threshold voltage of the cell may change so much that the cell overshoots its desired threshold voltage even on an initial program pulse. Therefore, using a high initial program voltage pulse could over program a highly cycled cell. A relatively low initial program voltage will move the threshold voltage of an uncycled or lightly cycled cell a small amount relative to the amount that same pulse would move a highly-cycled cell. Therefore, using a low initial program voltage pulse could result in longer program times for uncycled or nearly uncycled cells, since more program pulses would be needed to allow the cell to reach its target threshold voltage.

This present technology may utilize an error recovery scheme, such as involving interference compensation or ECC (Error Correcting Code) during lower page pre-reads at upper page programming. The error recovery scheme(s) can be selectively based on, for example, sub-block and WL (Word Line) location to maximize benefits obtained by the error recovery scheme(s) while minimizing performance overhead.

The application of a program voltage the control gate of a memory cell will alter the cell's threshold voltage to a greater degree the more times the cell is cycled. There also is a significant difference in the speed of programming for cells that are relatively uncycled as compared to cells that have been cycled many times. Therefore, a programming time for a memory page can be reduced by adjusting an initial program voltage applied to the cell so that it reaches its target threshold voltage using fewer programming pulses. For example, a relatively low initial pulse program voltage might be used for upper page programming of a cell that has been cycled many times, so as not to overshoot its desired threshold voltage. Meanwhile, a relatively high initial pulse program voltage might be used for upper page programming of a cell that is uncycled or has a low number of cycles.

Since NAND memory is programmed on a per page basis, each cell of a page has been cycled a same number of times. A number of times a page has been cycled also provides a number of times each cell of the page has been cycled. Cycle counters on each page of the memory take up die space, additional processing time, and storage space. Further, a page cycle counter cannot account for differences in cell performance based on factors other than a number of cycles the page has been through, for example, fabrication factors and the like.

After applying a single program pulse at a relatively low program voltage at a start of lower page programming for a page, an upper limit of a resulting cell threshold voltage distribution for cells on the page may be determined. If the page is uncycled or very lightly cycled, the low voltage pulse will not cause much of a shift in the distribution. If the page is heavily cycled, the low voltage pulse will cause a larger shift in the threshold voltage distribution. The initial program pulse voltage can be determined as a value defined by fuses of the memory device.

Certain invention embodiments provide for error recovery during pre-read of LP data to improve the accuracy of UP data programming. Any of a variety of error recovery schemes can be applied. Application of an error recovery scheme can be selective. In other words, a determination can be made as to whether to apply an error recovery scheme. Further, when an error recovery scheme is applied, a determination can be made as to which one or more error recovery schemes to apply.

FIG. 1 illustrates an example of upper page programming with error recovery during pre-read of the LP data in accordance with an invention embodiment. When programming of the UP data starts 210, the LP data may be pre-read 215. However, due to a shift in Vt or other cause, the LP data is misread as a '0' instead of '1'. While this would otherwise cause an error in the programming of the UP data, in this instance the LP data can be pre-read with an error recovery scheme.

Error recovery schemes can be applied based on word line (WL), sub-block, cycling count or any other suitable basis. Some example error recovery schemes include interference compensation from cells on one or more sides of the cell being programmed, controller ECC, read voltage search or any other suitable error recovery scheme. When pre-reading the LP data, a determination can be made as to whether to apply an error recovery scheme and which one or more error recovery schemes to apply.

With continued reference to FIG. 1, even though the LP '1' bit is misread as a '0', the bit is recovered through an error recovery scheme. As a result, the elaboration 220 process determines that with additional bit '0', the upper page data is to be programmed as '01' and the UP data is correctly programmed 225.

Application of error recovery schemes to LP pre-reads can result in a negative performance impact. For example, the amount of time required to complete UP programming is increased when an error recovery scheme is applied as compared with when an error recovery scheme is not used during the pre-read. Different error recovery schemes have different overhead costs in terms of resource usage, time expenditure and so forth. Application of an error recovery scheme may not be necessary for programming each cell. When the application of the error recovery scheme is unnecessary, the determination of whether to apply the error recovery scheme can determine that the application of the error recovery scheme is unnecessary and omit the application. When the application of the error recovery scheme is deemed useful, the determination of whether to apply the error recovery scheme can determine to apply the error recovery scheme. Further, depending on variables considered in applying an error recovery scheme, a determination can be made as to which error recovery scheme to apply to ensure accuracy of the LP pre-read data while also maintaining efficiency in UP programming.

Figure 2:
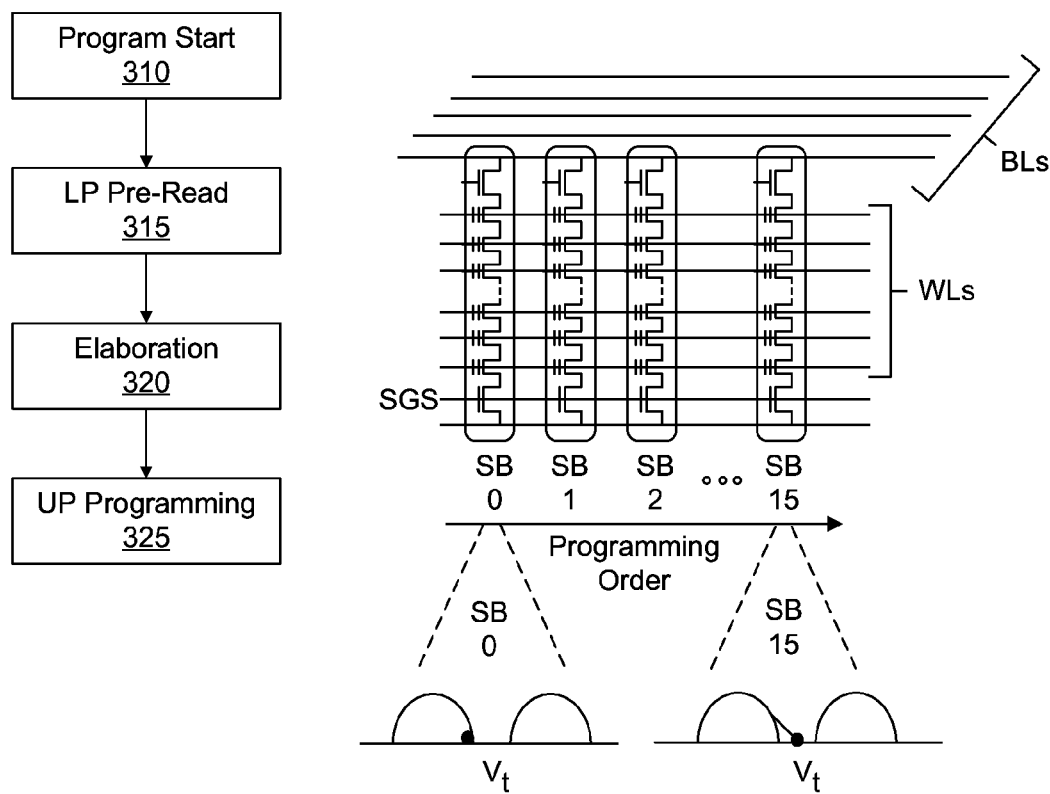
FIG. 2 illustrates an upper page programming process based on a programming order of sub-blocks in accordance with an invention example.

Reference will now be made to FIG. 2. A three dimensional memory device uses stacked memory arrays on a single die. Such architecture allows higher memory density in substantially the same die footprint. FIG. 2 illustrates one example of the architecture of a typical stacked NAND flash memory array adjacent to a flow diagram of a method for upper page programming including pre-reading of LP data with an error recovery option. The layers of the stacked NAND architecture share the same access lines (e.g., word lines (WL)), and select gate source lines (SGS). Each layer is selected by the data line (e.g., bit line (BL)) bias.

A programming operation starts 310 and includes applying a programming voltage (e.g., 20V) to the selected word lines being programmed. Since a word line is shared by all layers, bit line biasing (e.g., applying a bit line voltage) is used to inhibit layers that are not selected for programming. For example, the first and third layers can be selected to be programmed by biasing the respective bit lines at an enable voltage (e.g., 0V) while the unselected bit lines are biased at an inhibit voltage (e.g., 2V). Thus, the first and third layers can be selected while the other layers are unselected.

For erase and sense operations, all of the layers can be selected substantially simultaneously. In the sense operation, a single row of each layer is selected. For example, during a sense operation, all of the bit lines can be biased at a lower voltage (e.g., 0.5V) while the read voltage (Vr) is applied to the common word line. The unselected word lines can be biased at a pass voltage Vpass (e.g., 6V) and the select gate source (SGS) lines can be turned on (e.g., 5V).

During an erase operation, all of the bit lines can be biased at a relatively large erase voltage (e.g., 20V) while all of the word lines can be biased at a reference voltage (e.g., 0V). The select gate drain lines and common select gate source lines can be biased with a relatively large voltage (e.g., 20V).

One concern with programming in a stacked memory array architecture is the programming disturb that can occur due to a programming rate offset between layers. For example, if the first layer programs at a slower rate than the fourth layer, the relatively large voltages applied to the slower first layer in order to continue programming the first layer for a longer time than the faster fourth layer can cause programming stress to the fourth layer. Such disturb can cause errors during sense operations since the memory cell threshold voltages on the disturbed layer can be increased from the erased level or the originally programmed voltage levels.

Similarly as shown in FIG. 1, one invention method can include starting 310 programming, pre-reading 315 LP data with an error recovery scheme, such as a sub-block (SB) based error recovery scheme. As a result, elaboration 320 can determine the correct data to program as the UP data and the UP data can be programmed 325 correctly. Determination of whether to apply error recovery, and which error recovery to apply, can be based, for example on one or more of sub-block, word line, bit line, cycle count, etc.

FIG. 2 illustrates an LP Vt distribution at the beginning of UP programming at sub-block 0 (SB 0) and at sub-block 15 (SB 15). The LP data for SB 0 can be clearly read as '1' bit. However, higher sub-blocks have more stress before LP pre-read. As further shown in SB 15, the LP Vt distribution is shifted and the LP data can be misread as a '0' rather than '1'.

Performing error recovery at higher sub blocks can ensure accuracy of LP pre-reads for the higher sub-blocks. Less or no recovery may be applied for lower sub-blocks with lower stress and less likelihood of a misread. Use of less or no recovery at lower sub-blocks can improve performance and reliability of a memory device. Different recovery schemes can have different costs. Because stresses on higher sub-blocks are typically higher than on lower sub-blocks, increasingly costly error recovery schemes may be applied as programming progresses to increasingly higher sub-blocks, to ensure accuracy of LP pre-reads for all of the sub-blocks. Even when an LP Vt is shifted by a small amount, such as 100 mV, a mis-read of the LP Vt can result in, for example, a difference in the UP Vt of 1V. Thus, small errors can result in large differences. Present technology embodiments can assist in reducing or eliminating such mis-reads.

One example error recovery scheme is cell-to-cell interference compensation (sometimes referred to as inter-cell interference compensation). Cell-to-cell interference has been well recognized as a noise source responsible for raw-memory-storage reliability degradation. Cell-to-cell interference results in a Vt distribution shift by changing adjacent aggressor cell states. The interference is attributed to capacitive coupling via parasitic capacitors around a floating gate due to a coupling ratio. Cell-to-cell interference compensation may adjust the LP pre-read voltage Vt by some amount depending on whether the voltage of adjacent cells is higher or lower to compensate for Vt shifts caused by the adjacent higher or lower cell voltages. Cell-to-cell interference may be based on, for example, one adjacent cell state or multiple (e.g., 2) adjacent cell states.

Another example error recovery scheme is error recovery by controller. In other words, use of an ECC engine. NAND memory can use ECC to compensate for bits that spontaneously fail during normal device operation. If the ECC cannot correct the error during pre-read, it may still detect the error. When performing erase or program operations, such as UP programming, the memory device can detect blocks or sub-blocks that fail to program or erase and mark these blocks as bad. The data can then be written to a different, good block, and the bad block map is updated. Application of ECC may proceed as follows. The LP pre-read data can be output. The memory controller can recover the correct LP data using the ECC engine and send the correct data back to the NAND device. The corrected LP data can be used for elaboration and the correct values may then be programmed for UP programming.

Another example error recovery scheme is to perform a read voltage search (also sometimes referred to as read voltage adjusting). In this example, rather than referencing a fixed or pre-determined LP voltage value, the controller dynamically reads the voltage and determines a minimum bit error rate.

Each error recovery scheme has a cost associated therewith, such as in terms of time expenditure, and different schemes can be successful to different degrees. Combination of multiple schemes can provide cumulative results. In other words, combination of cell-to-cell interference compensation with a read voltage search can have a more powerful effect, or rather be more certain to result in recovery of the LP data bit than either cell-to-cell interference compensation or read voltage search individually.

Variations of the cells on the page, including word line to word line variations, block to block variations, and also process variations, can all be taken into account using the methods disclosed herein. Thus, instead of or in addition to counting cycles of a page and estimating an effect of the amount of cycles, measures such as the specific WL or SB can be used to adjust upper page programming.

EXAMPLES

By way of a general example implementation of invention embodiments, Table 1 below provides a list of sub-blocks for UP programming, along with an error recovery scheme to be applied and a time penalty or time cost associated with each error recovery scheme.

TABLE 1

| Sub-block | LP pre-read | Time overhead |
|---|---|---|
| 0 | standard | 0 us |
| 1 | standard | 0 us |
| 2 | standard | 0 us |
| 3 | standard | 0 us |
| 4 | Error recovery 1 | Time 1 |
| 5 | Error recovery 1 | Time 1 |
| 6 | Error recovery 1 | Time 1 |
| 7 | Error recovery 1 | Time 1 |
| 8 | Error recovery 2 | Time 2 |
| 9 | Error recovery 2 | Time 2 |
| 10 | Error recovery 2 | Time 2 |
| 11 | Error recovery 2 | Time 2 |

TABLE 1-continued

| Sub-block | LP pre-read | Time overhead |
|---|---|---|
| 12 | Error recovery 3 | Time 3 |
| 13 | Error recovery 3 | Time 3 |
| 14 | Error recovery 3 | Time 3 |
| 15 | Error recovery 3 | Time 3 |

In this example, the 16 sub-blocks have been divided into groups of four, each having a different application of a recovery scheme. Sub-blocks 0-3 follow a standard procedure with no recovery. The time overhead or cost for this is 0 because it adds no additional time to the standard UP programming. Sub-blocks 4-7 "apply error recovery 1" associated with time cost "time 1". Sub-blocks 8-11 "apply error recovery 2" associated with time cost "time 2". Sub-blocks 12-15 "apply error recovery 3" associated with time cost "time 3". Because the likelihood of errors in the LP pre-read data increases as the sub-block number increases, error recovery 3 may typically be more powerful and effective than error recovery 2, but with less efficiency and a greater time penalty. Similarly, error recovery 2 may typically be more powerful and effective than error recovery 1, but with less efficiency and a greater time penalty.

A more specific example series of error recovery schemes to be applied for increasingly higher numbered sub-blocks during UP programming is provided below in Table 2.

TABLE 2

| Sub-block | LP pre-read | Time overhead |
|---|---|---|
| 0 | standard | 0 us |
| 1 | standard | 0 us |
| 2 | standard | 0 us |
| 3 | standard | 0 us |
| 4 | standard | 0 us |
| 5 | Interference compensation 1 side | 60 us |
| 6 | Interference compensation 1 side | 60 us |
| 7 | Interference compensation 2 sides | 120 us |
| 8 | Interference compensation 2 sides | 120 us |
| 9 | Controller ECC | 320 us |
| 10 | Controller ECC | 320 us |
| 11 | Controller ECC | 320 us |
| 12 | Controller ECC | 320 us |
| 13 | Controller ECC | 320 us |
| 14 | Controller ECC | 320 us |
| 15 | Controller ECC | 320 us |

As can be appreciated by the difference between Table 1 and Table 2, error recovery schemes may be applied to the sub-blocks in groups of sub-blocks that are not evenly divided among the different schemes. For example, while each of the schemes in Table 1 were applied to even groups of four sub-blocks per scheme, Table 2 includes schemes with 2, 5 and 7 sub-blocks associated therewith. Determination of which sub-blocks to apply which error recovery scheme may vary to suit particular applications and the examples in Tables 1 and 2 or not intended to be limiting.

Table 2 shows that for sub-blocks 0-4, UP programming proceeds according to a standard process, without error recovery during the LP pre-read. Sub-blocks 5-6 utilize interference compensation as an error recovery scheme with consideration of cells or blocks or sub-blocks on a single side of the current cell or block or sub-block. Sub-blocks 7-8 utilize interference compensation as an error recovery scheme with consideration of cells or blocks or sub-blocks on two sides of the current cell or block or sub-block. Controller ECC is applied for sub-blocks 9-15. Some example time costs are included in Table 2 illustrating how the time cost can increase from one error recovery scheme to another.

While at least some of the foregoing description has described selection and application of an error recovery scheme for recovering LP pre-read errors based on sub-block number, invention embodiments are not limited to selection/application of error recovery based on sub-block number. Table 3 below is a general example of pre-read error recovery scheme selection based on UP programming WL location rather than sub-block.

TABLE 3

| WL | LP pre-read | Time overhead |
|---|---|---|
| 0-3 | Error recovery 3 | Time3 |
| 4-16 | Standard | 0 us |
| 17-20 | Error recovery 1 | Time1 |
| 21-28 | Error recovery 2 | Time2 |
| 29-32 | Error recovery 3 | Time3 |

As can be appreciated from Table 3, application of an error recovery scheme based on WL may differ from previous examples of application of the error recovery scheme based on sub-block. WL error recovery application can, for example, be applied to groups of WLs, but can be in an order other than increasing strength/cost as the WL number increases. The determination of which WLs to apply which error recovery scheme may be based on a likelihood of error for the particular WLs. More error prone WLs apply a more effective, but more costly error recovery than less error prone WLs.

Table 4 below provides a more specific example implementation of error recovery by WL.

TABLE 4

| WL | LP pre-read | Time overhead |
|---|---|---|
| 0-3 | Controller ECC | 320 us |
| 4-16 | Standard | 0 us |
| 17-20 | Interference compensation 1 side | 60 us |
| 21-28 | Interference compensation 1 side | 60 us |
| 29-32 | Controller ECC | 320 us |

While the previous examples referred to in Tables 1-4 have primarily applied LP pre-read error recovery schemes based on sub-block or WL, selection of a pre-read error recovery scheme can be on any other suitable basis. For example, a memory device can switch pre-read error recovery schemes based on a program/erase cycling count. As another example, pre-read error recovery schemes can be selected based on a combination of two or more bases, such as based on a combination of two or more of sub-block, WL location and cycling count.

Figure 3:
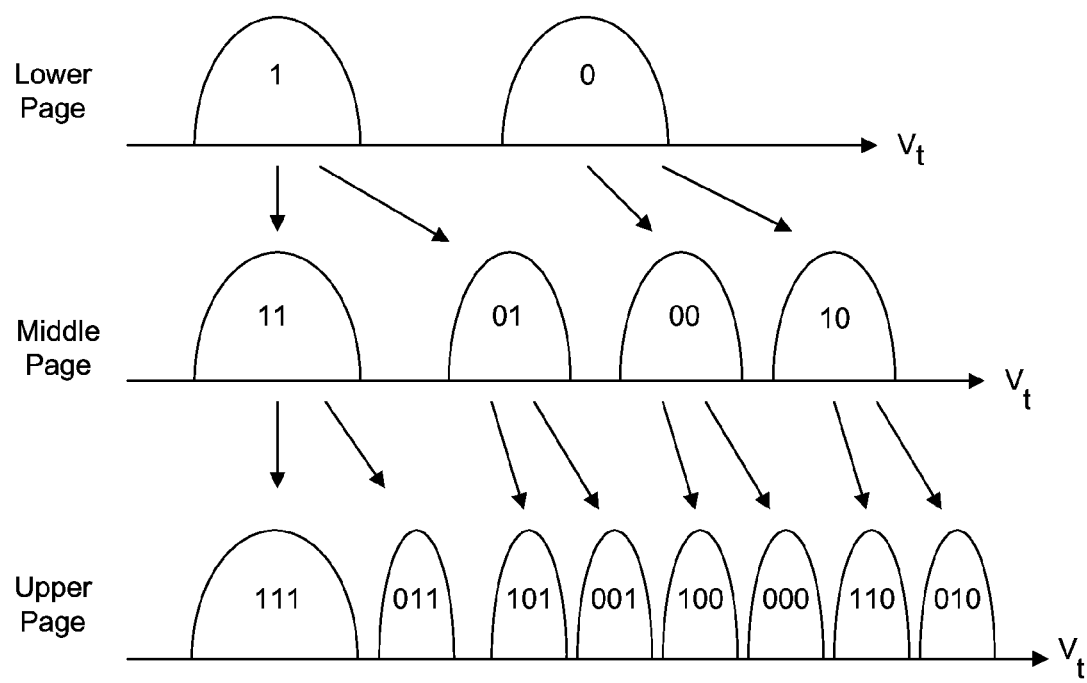
FIG. 3 illustrates a diagram of upper page programming in a three bit per cell memory with error correction applied to lower page and/or middle page data in accordance with an invention example.

While the description has thus far primarily referred to UP programming for two bit per cell memory devices, the concepts can be applied to three bit per cell memory devices or greater. FIG. 3 represents an example of three bit per cell implementation. Whether the number of bits per cell is two, three or a greater number, the UP programming is based at least indirectly on the LP data.

In FIG. 3, a process for programming the UP data can pre-read the LP data and perform elaboration based on the LP data and an additional bit to determine and program the middle page (MP) data. The MP data can be pre-read and the MP data and an additional bit can be used for elaboration and programming of the UP data. Error recovery can be applied when pre-reading the LP data and/or the MP data to ensure accuracy of the UP data programming.

Figure 4:
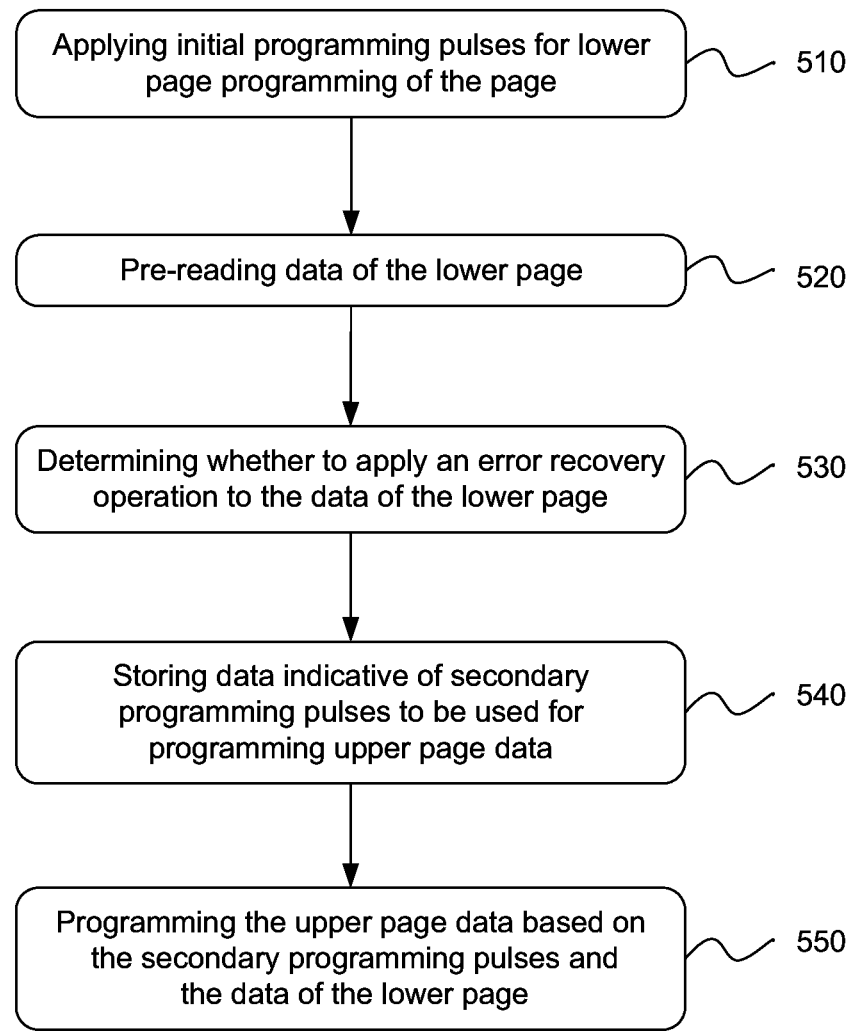
FIGS. 4-6 illustrate flow diagrams of methods for programming a page of a memory in a NAND memory device in accordance with various invention examples.

Referring to FIG. 4, a flow diagram of a computer-implemented method for programming a page of a memory in a NAND memory device is illustrated in accordance with an example of an invention embodiment. The method includes applying 510 initial programming pulses for lower page programming of the page and pre-reading 520 data of the lower page. The method further includes determining 530 whether to apply an error recovery operation to the data of the lower page. Data indicative of secondary programming pulses to be used for programming upper page data are stored 540 and the upper page data is programmed 550 based on the secondary programming pulses and the data of the lower page.

When the memory device is a three bit per cell device, the method can include storing data indicative of tertiary programming pulses to be used for programming middle page data and programming the middle page data based on the tertiary programming pulses and the data of the lower page. For programming the upper page data, the method further includes pre-reading the middle page data and programming the upper page data based on the secondary programming pulses and the data of the lower page comprises programming the upper page data based on the secondary pulses and the data of the middle page. Programming the upper page data in this example is still based, at least indirectly, on the programming of the lower page data because the middle page data is programmed based on the data of the lower page.

The method can include determining whether programming the upper page data comprises programming a lower sub-block or programming a higher sub-block. The method can include forgoing error recovery for the lower sub-block and applying the error recovery for the higher sub-block.

The method can include use of one or more of a plurality of different error recovery operations. As stated above, these operations can vary by sub-block. These operations can vary based on a word line location for the upper page programming. These operations can vary by program/erase cycle count. These operations can vary based on a combination of two or more of sub-block, word line location or program/erase cycle count. To facilitate variation of error recovery operations by cycle count, the method can include determining a number of programming cycles for the lower page and applying the error recovery operation when the number of programming cycles exceeds a predetermined threshold.

One example error recovery operation includes interference compensation by modifying a read voltage of a sub-block of the data of the lower page based on a read voltage of an adjacent wordline. For example, the read voltage of the sub-block of the data of the lower page can be modified based on the read voltage of a single adjacent wordline. As another example, the read voltage of the sub-block of the data of the lower page can be modified based on the read voltage of multiple adjacent wordlines.

Another example error recovery operation includes outputting the pre-read data of the lower page to a controller, such as an ECC controller. The operation can then include correcting the data with the controller, sending the data back to the memory device, and using the corrected data at the memory device for programming the upper page data.

Another example error recovery operation includes performing a read voltage search. The read voltage search can be performed using a controller that determines a read voltage for a minimum bit error rate and adjusts a read voltage of the data of the lower page based on the read voltage for the minimum bit error rate. In this example, the read voltage of the data of the lower page can be variable and not fixed or predetermined.

Figure 5:
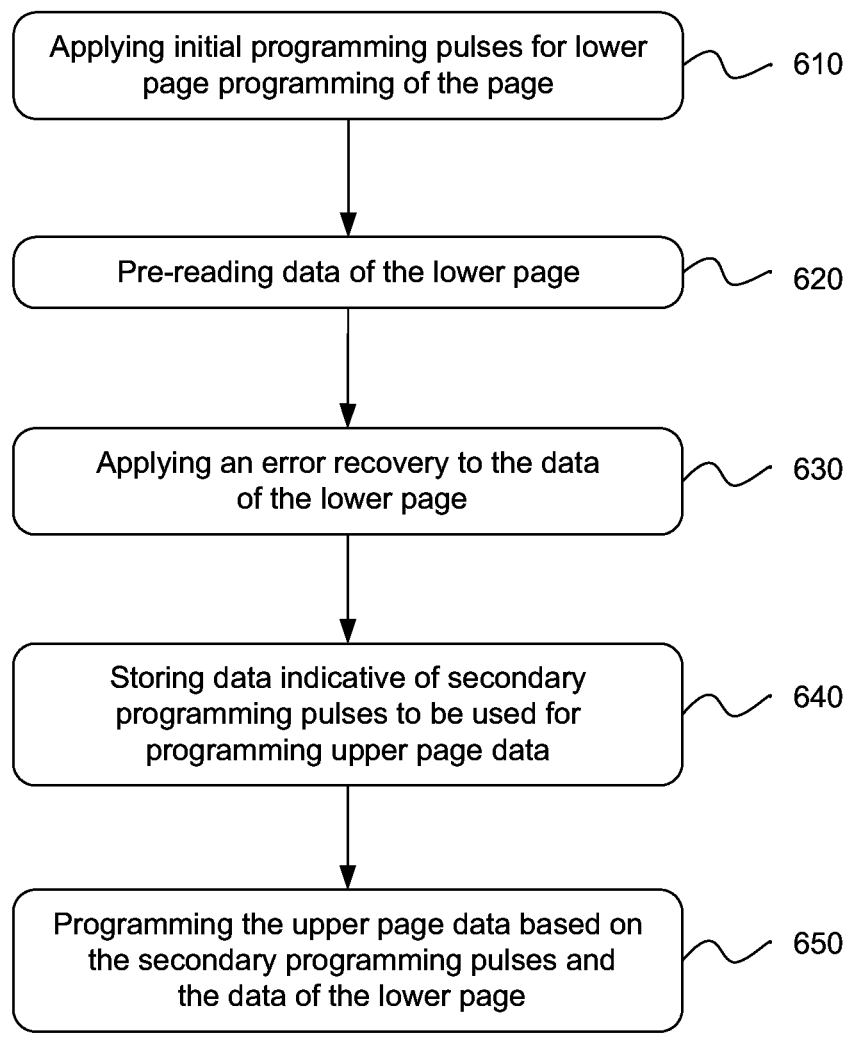

Referring now to FIG. 5, a flow diagram of a computer-implemented method for programming a page of a memory in a NAND memory device is illustrated in accordance with another example of an invention embodiment. The method includes applying 610 an initial programming pulse for lower page programming of the page; pre-reading 620 data of the lower page; and applying 630 an error recovery to the data of the lower page. The method can further include storing 640 data indicative of a secondary programming pulse to be used for programming upper page data, and programming 650 the upper page data based on the secondary programming pulse and the data of the lower page.

When programming lower sub-blocks of the upper page, a first error recovery operation can be applied. When programming middle sub-blocks of the upper page, a second error recovery operation can be applied. When programming higher sub-blocks of the upper page, a third error recovery operation can be applied. Each of the first, second and third error recovery operations are different. Each of the first, second and third error recovery operations have different time costs. The number of sub-blocks per error recovery operation can be evenly distributed among the error recovery options or unevenly distributed. In other words, and as an example, the lower sub-blocks, middle sub-blocks, and higher sub-blocks can be groups of sub-blocks each comprising an equal number of sub-blocks. As another example, the lower sub-blocks, middle sub-blocks, and higher sub-blocks are groups of sub-blocks, at least two of which groups comprise different numbers of sub-blocks.

The error recovery operation can include a plurality of different error recovery operations that vary based on a word line location for the upper page programming. The error recovery options can also vary based on cycle count, as described previously.

The method can include progressively applying increasingly time costly error recovery to the data of the lower page when programming the upper page, such as when programming sub-blocks or wordlines of the upper page.

Figure 6:
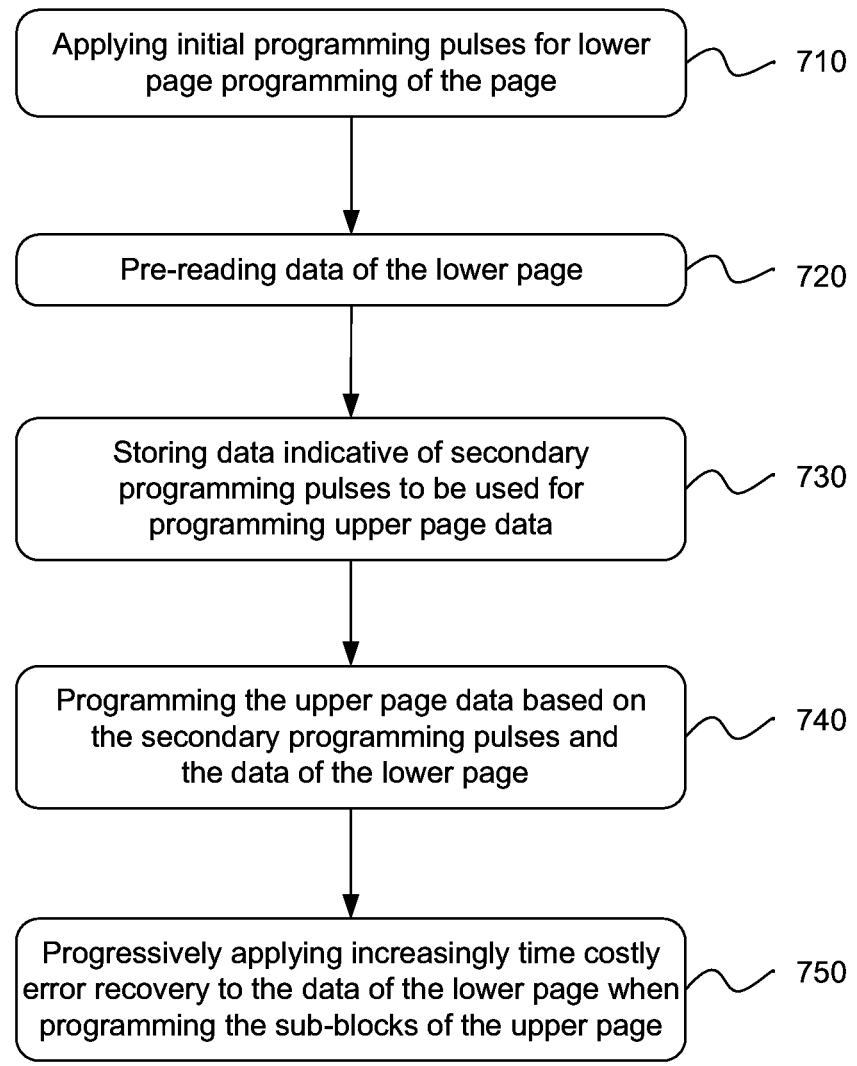

Referring now to FIG. 6, a flow diagram of a computer-implemented method for programming a page of a memory in a NAND memory device is illustrated in accordance with another example of an invention embodiment. The method includes applying 710 initial programming pulses for lower page programming of the page and pre-reading 720 data of the lower page. The method can include applying error recovery to the data of the lower page. Data indicative of secondary programming pulses to be used for programming upper page data can be stored 730 and the upper page data can be programmed 740 based on the secondary programming pulses (or rather, the data indicative of the secondary programming pulses) and the data of the lower page. The method can include progressively applying increasingly time costly error recovery to the data of the lower page when programming the sub-blocks of the upper page.

In one example, an invention embodiment provides a data storage system. The system can include a processor, a power source, and a NAND memory coupled to the processor and including an array of cells (and powered by the power source). The data storage system can include circuitry configured to perform programming and reading methods. For example, the method can include applying initial programming pulses for lower page programming of the page; pre-reading data of the lower page; applying an error recovery to the data of the lower page; storing data indicative of secondary programming pulses to be used for programming upper page data; and programming the upper page data based on the secondary programming pulses and the data of the lower page.

In one example, an invention embodiment provides a NAND memory or NAND memory device. The NAND memory can include an array of NAND memory cells; and circuitry configured to perform a method. For example, the method can include applying initial programming pulses for lower page programming of the page; pre-reading data of the lower page; determining whether to apply an error recovery operation to the data of the lower page; storing data indicative of secondary programming pulses to be used for programming upper page data; and programming the upper page data based on the secondary programming pulses and the data of the lower page.

Features of the systems or apparatuses described previously or later may also be implemented with respect to the method or any processes described herein, and vice versa. Also, specifics in the examples may be used anywhere in one or more embodiments.

Figure 7:
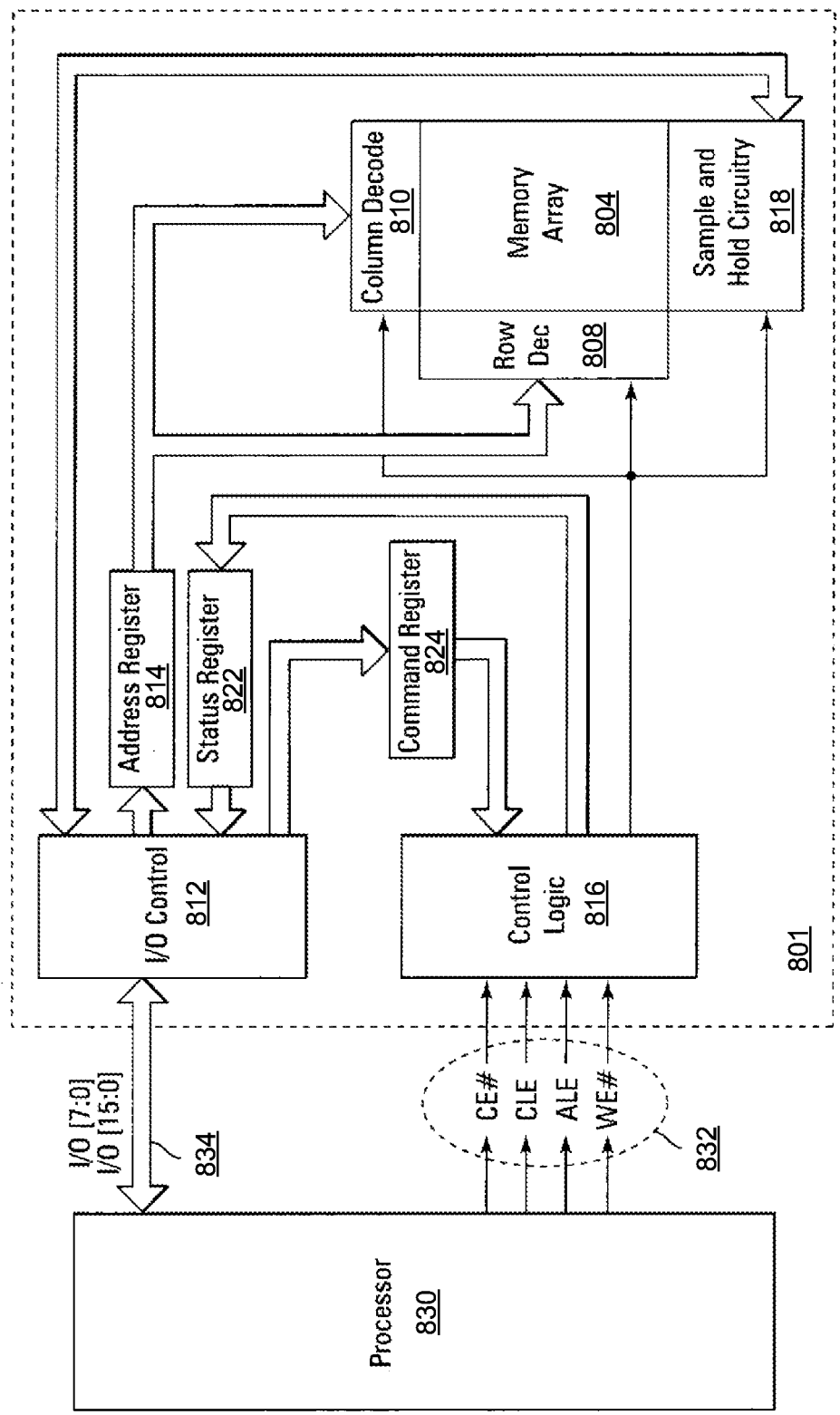
FIG. 7 illustrates a memory system diagram in accordance with an invention example.

Reference will now be made to FIG. 7. FIG. 7 is a simplified block diagram of a memory device 801 according to an invention embodiment, and on which various methods can be practiced. Memory device 801 includes an array of memory cells 804 arranged in rows and columns. Although the various embodiments will be described primarily with reference to NAND memory arrays, the various embodiments are not limited to a specific architecture of the memory array 804. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 808 and a column decode circuitry 810 are provided to decode address signals provided to the memory device 801. Address signals are received and decoded to access memory array 804. Memory device 801 also includes input/output (I/O) control circuitry 812 to manage input of commands, addresses and data to the memory device 801 as well as output of data and status information from the memory device 801. An address register 814 is coupled between I/O control circuitry 812 and row decode circuitry 808 and column decode circuitry 810 to latch the address signals prior to decoding. A command register 824 is coupled between I/O control circuitry 812 and control logic 816 to latch incoming commands. Control logic 816 controls access to the memory array 804 in response to the commands and generates status information for the external processor 830. The control logic 816 is coupled to row decode circuitry 808 and column decode circuitry 810 to control the row decode circuitry 808 and column decode circuitry 810 in response to the addresses.

Control logic 816 can be coupled to a sample and hold circuitry 818. The sample and hold circuitry 818 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 818 may further provide for amplification and/or buffering of the sampled signal to provide a stronger data signal to an external device.

The handling of analog data signals may take an approach similar to an approach well known in the area of CMOS imager technology, where charge levels generated at pixels of the imager in response to incident illumination are stored on capacitors. These charge levels are then converted to signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 812 for output from the memory device, in the case of a read operation, or used for comparison during one or more verify operations in programming the memory device. It is noted that the I/O control circuitry 812 could optionally include analog-to-digital conversion functionality and digital-to-analog conversion (DAC) functionality to convert read data from an analog data signal to a digital bit pattern and to convert write data from a digital bit pattern to an analog signal such that the memory device 801 could be adapted for communication with either an analog or digital data interface.

During a programming operation, target memory cells of the memory array 804 are programmed until voltages indicative of their Vt levels match the levels held in the sample and hold circuitry 818. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 818 for transfer to an external processor (not shown in FIG. 7) either directly as analog signals or as digitized representations of the analog signals depending upon whether ADC/DAC functionality is provided external to, or within, the memory device.

Threshold voltages of cells may be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 818 may include caching, i.e., multiple storage locations for each data value, such that the memory device 801 may be reading a next data value while passing a first data value to the external processor, or receiving a next data value while writing a first data value to the memory array 804. A status register 822 is coupled between I/O control circuitry 812 and control logic 816 to latch the status information for output to the external processor.

Memory device 801 receives control signals at control logic 816 over a control link 832. The control signals may include a chip enable CE#, a command latch enable CLE, an address latch enable ALE, and a write enable WE#. Memory device 801 may receive commands (in the form of command signals), addresses (in the form of address signals), and data (in the form of data signals) from an external processor over a multiplexed input/output (I/O) bus 834 and output data to the external processor over I/O bus 834.

In a specific example, commands are received over input/output (I/O) pins [7:0] of I/O bus 834 at I/O control circuitry 812 and are written into command register 824. The addresses are received over input/output (I/O) pins [7:0] of bus 834 at I/O control circuitry 812 and are written into address register 814. The data may be received over input/output (I/O) pins [7:0] for a device capable of receiving eight parallel signals, or input/output (I/O) pins [15:0] for a device capable of receiving sixteen parallel signals, at I/O control circuitry 812 and are transferred to sample and hold circuitry 818. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 7 has been simplified to help focus on the embodiments of the disclosure.

Methods for applying error recovery during lower page data pre-reads for upper page programming of a memory may be performed in various embodiments on a memory such as memory 801. Such methods are shown and described herein with reference to FIGS. 1-6.

While FIG. 7 has been described with respect to sample and hold circuitry 818, it should be understood that the control logic 816 could be coupled to data latches instead of sample and hold circuitry 818 without departing from the scope of the disclosure. Data latches latch data, either incoming or outgoing. During a write operation, target memory cells of the memory array 804 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 7 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 834. Because the data signals represent bit patterns instead of individual bits, serial communication of an 8-bit data signal could be as efficient as parallel communication of eight signals representing individual bits.

Various techniques, or certain aspects or portions thereof, may take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, solid state drive, or other medium for storing electronic data. The node and wireless device may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

In one example of an invention embodiment provides, a NAND memory device, said device having: an array of NAND memory cells; and a controller configured to apply initial programming pulses for lower page programming of the page, pre-read data of the lower page, determine whether to apply an error recovery operation to the data of the lower page, store data indicative of secondary programming pulses to be used for programming upper page data; and program the upper page data based on the secondary programming pulses and the data of the lower page.

In one example, the error recovery operation comprises a plurality of different error recovery operations that vary based on a word line location for the upper page programming.

In one example, when programming lower sub-blocks of the upper page a first error recovery operation is applied, when programming middle sub-blocks of the upper page a second error recovery operation is applied, and when programming higher sub-blocks of the upper page a third error recovery operation is applied.

In one example, determining whether to apply the error recovery operation to the data of the lower page comprises determining whether programming the upper page data comprises programming a lower sub-block or programming a higher sub-block, the method further comprising forgoing error recovery for the lower sub-block and applying the error recovery for the higher sub-block.

In one example, determining whether to apply the error recovery operation to the data of the lower page comprises determining a number of programming cycles for the lower page and applying the error recovery operation when the number of programming cycles exceeds a predetermined threshold.

In one example, when programming lower sub-blocks of the upper page a first error recovery operation is applied, when programming middle sub-blocks of the upper page a second error recovery operation is applied, and when programming higher sub-blocks of the upper page a third error recovery operation is applied.

In one example, each of the first, second and third error recovery operations are different.

In one example, the lower sub-blocks, middle sub-blocks, and higher sub-blocks are groups of sub-blocks each comprising an equal number of sub-blocks.

In one example, the lower sub-blocks, middle sub-blocks, and higher sub-blocks are groups of sub-blocks, at least two of which groups comprise different numbers of sub-blocks.

In one example, each of the first, second and third error recovery operations have different time costs.

In one example, the error recovery operation comprises a plurality of different error recovery operations that vary based on a word line location for the upper page programming.

In one example, the error recovery operation comprises a plurality of different error recovery operations that vary based on a combination of word line location for the upper page programming, sub-block for the upper page programming or cycle count for the pre-reading of the data of the lower page.

In one example, the memory device further includes progressively applying increasingly time costly error recovery to the data of the lower page when programming the sub-blocks of the upper page.

In one exemplary invention embodiment is provided, a data storage system, said system including: a processor; a power source; a NAND memory coupled to the processor and including an array of cells; and a controller configured to apply initial programming pulses for lower page programming of the page, pre-read data of the lower page, apply an error recovery to the data of the lower page, store data indicative of secondary programming pulses to be used for programming upper page data; and program the upper page data based on the secondary programming pulses and the data of the lower page, wherein when applying the error recovery to the data of the lower page, the controller progressively applies different error recovery schemes to the data of the lower page during programming of the upper page data.

In one example, the error recovery operation comprises a plurality of different error recovery operations that vary based on a word line location for the upper page programming.

In one example, when programming lower sub-blocks of the upper page a first error recovery operation is applied, when programming middle sub-blocks of the upper page a second error recovery operation is applied, and when programming higher sub-blocks of the upper page a third error recovery operation is applied.

In one example, the error recovery comprises interference compensation by modifying a read voltage of a sub-block of the data of the lower page based on a read voltage of an adjacent wordline.

In one example, the read voltage of the sub-block of the data of the lower page is modified based on the read voltage of a single adjacent wordline.

In one example, the read voltage of the sub-block of the data of the lower page is modified based on the read voltage of multiple adjacent wordlines.

In one example, wherein the error recovery operation comprises outputting the pre-read data of the lower page to a controller, correcting the data with the controller, and using the corrected data for programming the upper page data.

In one example, the error recovery operation comprises a read voltage search, using a controller that determines a read voltage for a minimum bit error rate and adjusts a read voltage of the data of the lower page based on the read voltage for the minimum bit error rate.

In one example, the read voltage of the data of the lower page is variable.

In one example, the error recovery operation comprises a plurality of different error recovery operations that vary based on a word line location for the upper page programming.

In an exemplary invention embodiment, a computer-implemented method of programming a page of a memory in a NAND memory device is provided which includes: applying initial programming pulses for lower page programming of the page; pre-reading data of the lower page; storing data indicative of secondary programming pulses to be used for programming upper page data; programming the upper page data based on the secondary programming pulses and the data of the lower page; and progressively applying increasingly time costly error recovery to the data of the lower page when programming the sub-blocks of the upper page.

In one example, the error recovery operation comprises a plurality of different error recovery operations that vary based on a word line location for the upper page programming.

In one example, when programming lower sub-blocks of the upper page a first error recovery operation is applied, when programming middle sub-blocks of the upper page a second error recovery operation is applied, and when programming higher sub-blocks of the upper page a third error recovery operation is applied.

One example invention embodiment provides a computer-implemented method of programming a page of a memory in a NAND memory device, comprising: applying initial programming pulses for lower page programming of the page; pre-reading data of the lower page; determining whether to apply an error recovery operation to the data of the lower page; storing data indicative of secondary programming pulses to be used for programming upper page data; and programming the upper page data based on the secondary programming pulses and the data of the lower page.

In one example, the method may further include storing data indicative of tertiary programming pulses to be used for programming middle page data; programming the middle page data based on the tertiary programming pulses and the data of the lower page; and pre-reading the middle page data; wherein programming the upper page data based on the secondary programming pulses and the data of the lower page comprises programming the upper page data based on the secondary pulses and the data of the middle page, the middle page data being programmed based on the data of the lower page.

In one example embodiment, determining whether to apply the error recovery operation to the data of the lower page comprises determining whether programming the upper page data comprises programming a lower sub-block or programming a higher sub-block, the method further comprising forgoing error recovery for the lower sub-block and applying the error recovery for the higher sub-block.

In one example embodiment, the error recovery comprises interference compensation by modifying a read voltage of a sub-block of the data of the lower page based on a read voltage of an adjacent wordline.

In one example embodiment, the read voltage of the sub-block of the data of the lower page is modified based on the read voltage of a single adjacent wordline.

In one example embodiment, the read voltage of the sub-block of the data of the lower page is modified based on the read voltage of multiple adjacent wordlines.

In one example embodiment, the error recovery operation comprises outputting the pre-read data of the lower page to a controller, correcting the data with the controller, and using the corrected data for programming the upper page data.

In one example embodiment, the error recovery operation comprises a read voltage search, using a controller that determines a read voltage for a minimum bit error rate and adjusts a read voltage of the data of the lower page based on the read voltage for the minimum bit error rate.

In one example embodiment, the read voltage of the data of the lower page is variable.

In one example embodiment, determining whether to apply the error recovery operation to the data of the lower page comprises determining a number of programming cycles for the lower page and applying the error recovery operation when the number of programming cycles exceeds a predetermined threshold.

In one example embodiment, the error recovery operation comprises a plurality of different error recovery operations that vary based on a word line location for the upper page programming.

One example embodiment provides a computer-implemented method of programming a page of a memory in a NAND memory device, comprising: applying initial programming pulses for lower page programming of the page; pre-reading data of the lower page; progressively applying an error recovery to the data of the lower page; storing data indicative of secondary programming pulses to be used for programming upper page data; and programming the upper page data based on the secondary programming pulses and the data of the lower page.

In one example, when programming lower sub-blocks of the upper page a first error recovery operation is applied, when programming middle sub-blocks of the upper page a second error recovery operation is applied, and when programming higher sub-blocks of the upper page a third error recovery operation is applied.

In one example, each of the first, second and third error recovery operations are different.

In one example, the lower sub-blocks, middle sub-blocks, and higher sub-blocks are groups of sub-blocks each comprising an equal number of sub-blocks.

In one example, the lower sub-blocks, middle sub-blocks, and higher sub-blocks are groups of sub-blocks, at least two of which groups comprise different numbers of sub-blocks.

In one example, each of the first, second and third error recovery operations have different time costs.

In one example, the error recovery operation comprises a plurality of different error recovery operations that vary based on a word line location for the upper page programming.

In one example, the error recovery operation comprises a plurality of different error recovery operations that vary based on a combination of word line location for the upper page programming, sub-block for the upper page programming or cycle count for the pre-reading of the data of the lower page.

In one example, the method further includes progressively applying increasingly time costly error recovery to the data of the lower page when programming the sub-blocks of the upper page In one exemplary invention embodiment there is provided a computer-implemented method of programming a page of a memory in a NAND memory device, comprising: applying initial programming pulses for lower page programming of the page; pre-reading data of the lower page; storing data indicative of secondary programming pulses to be used for programming upper page data; programming the upper page data based on the secondary programming pulses and the data of the lower page; and progressively applying increasingly time costly error recovery to the data of the lower page when programming the sub-blocks of the upper page.

In one example, the error recovery operation comprises a plurality of different error recovery operations that vary based on a word line location for the upper page programming.

In one example, when programming lower sub-blocks of the upper page a first error recovery operation is applied, when programming middle sub-blocks of the upper page a second error recovery operation is applied, and when programming higher sub-blocks of the upper page a third error recovery operation is applied.

While the foregoing examples are illustrative of the principles of various invention embodiments, in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A NAND memory device, comprising:
    an array of NAND memory cells; and
    a controller configured to:
    apply initial programming pulses for lower page programming of a page;
    pre-read data of a lower page;
    determine whether to apply an error recovery operation to the data of the lower page;
    store data indicative of secondary programming pulses to be used for programming upper page data; and
    program the upper page data based on the secondary programming pulses and the data of the lower page;
    wherein when programming lower sub-blocks of the upper page a first error recovery operation is applied, when programming middle sub-blocks of the upper page a second error recovery operation is applied, and when programming higher sub-blocks of the upper page a third error recovery operation is applied and wherein either:
    each of the first, second and third error recovery operations are different; or
    the lower sub-blocks, middle sub-blocks, and higher sub-blocks are groups of sub-blocks each comprising an equal number of sub-blocks; or
    the lower sub-blocks, middle sub-blocks, and higher sub-blocks are groups of sub-blocks each comprising an equal number of sub-blocks; or
    each of the first, second and third error recovery operations have different time costs.

2. The memory device of claim 1, wherein determining whether to apply the error recovery operation to the data of the lower page comprises determining whether programming the upper page data comprises programming a lower sub-block or programming a higher sub-block, the method further comprising forgoing error recovery for the lower sub-block and applying the error recovery for the higher sub-block.

3. The memory device of claim 1, wherein determining whether to apply the error recovery operation to the data of the lower page comprises determining a number of programming cycles for the lower page and applying the error recovery operation when the number of programming cycles exceeds a predetermined threshold.

4. The memory device of claim 1, wherein the error recovery operation comprises a plurality of different error recovery operations that vary based on a word line location for the upper page programming.

5. The memory device of claim 1, wherein the error recovery operation comprises a plurality of different error recovery operations that vary based on a combination of word line location for upper page programming, sub-block for the upper page programming or cycle count for the pre-reading of the data of the lower page.

6. The memory device of claim 1, further comprising progressively applying increasingly time costly error recovery to the data of the lower page when programming sub-blocks of the upper page.

7. A data storage system, comprising:
a processor;
a power source; and
a NAND memory as recited in claim 1 coupled to the processor.

8. The system of claim 7, wherein the error recovery operation comprises a plurality of different error recovery operations that vary based on a word line location for the upper page programming.

9. The system of claim 7, wherein the error recovery comprises interference compensation by modifying a read voltage of a sub-block of the data of the lower page based on a read voltage of an adjacent wordline.

10. The system of claim 9, wherein the read voltage of the sub-block of the data of the lower page is modified based on the read voltage of a single adjacent wordline.

11. The system of claim 9, wherein the read voltage of the sub-block of the data of the lower page is modified based on the read voltage of multiple adjacent wordlines.

12. The system of claim 7, wherein the error recovery operation comprises outputting the pre-read data of the lower page to the controller, correcting the lower page data with the controller, and using the corrected data for programming the upper page data.

13. The system of claim 7, wherein the error recovery operation comprises a read voltage search, using the controller that determines a read voltage for a minimum bit error rate and adjusts a read voltage of the data of the lower page based on the read voltage for the minimum bit error rate.

14. A computer-implemented method of programming a page of a memory in a NAND memory device, comprising:
applying initial programming pulses for lower page programming of a page;
pre-reading data of a lower page;
determining whether to apply an error recovery operation to the data of the lower page;
storing data indicative of secondary programming pulses to be used for programming upper page data;
programming the upper page data based on the secondary programming pulses and the data of the lower page;
and further comprising:
storing data indicative of tertiary programming pulses to be used for programming middle page data;
programming the middle page data based on the tertiary programming pulses and the data of the lower page; and
pre-reading the middle page data;
wherein programming the upper page data based on the secondary programming pulses and the data of the lower page comprises programming the upper page data based on the secondary pulses and the data of the middle page, the middle page data being programmed based on the data of the lower page.

* * * * *